United States Patent
Chen

(10) Patent No.: US 6,531,328 B1
(45) Date of Patent: Mar. 11, 2003

(54) PACKAGING OF LIGHT-EMITTING DIODE

(75) Inventor: Hsing Chen, Hsin Chu (TW)

(73) Assignee: Solidlite Corporation, Ju-Bei (TW)

( * ) Notice: Subject to any disclaimer, the term of this patent is extended or adjusted under 35 U.S.C. 154(b) by 0 days.

(21) Appl. No.: 09/973,777

(22) Filed: Oct. 11, 2001

(51) Int. Cl.[7] .............................................. H01L 21/00
(52) U.S. Cl. ........................... 438/26; 438/25; 438/28; 438/43; 438/106
(58) Field of Search ................ 438/106, 26, 28, 438/43, 25

(56) References Cited

U.S. PATENT DOCUMENTS

| | | | | |
|---|---|---|---|---|
| 5,024,966 A | * | 6/1991 | Dietrich et al. | 438/23 |
| 6,060,729 A | * | 5/2000 | Suzuki et al. | 257/99 |
| 6,268,660 B1 | * | 7/2001 | Dhong et al. | 257/774 |

* cited by examiner

*Primary Examiner*—Amir Zarabian
*Assistant Examiner*—Christy Novacek
(74) *Attorney, Agent, or Firm*—Rosenberg, Klein & Lee

(57) ABSTRACT

The present invention of "Packaging of Light-Emitting Diode" is mainly to use silicon wafer as the substrate, whose crystal surface has a specific orientation for etching to form grooves. On the back of silicon substrate, dry etching is used for through-hole electrodes. Meanwhile, the insulating oxide layer or the nitride layer on silicon surface is plated with a reflective layer and an electrode layer, so the LED substrate is actually made of "silicon substrate". Through the procedures including placement of LED chips in the grooves of a silicon substrate, die bonding, wire bonding, encapsulation and cutting, SMD LED can be formed. Compared to traditional LED packaging that uses circuit boards or metal leadframes as main packaging substrates, the present invention is a breakthrough, which uses silicon wafers as substrates, so it has several advantages including good heat dissipation, high heat resistance and easy miniaturization, which are not seen in common LED presently.

7 Claims, 7 Drawing Sheets

PACKAGING OF LIGHT-EMITTING DIODE

BACKGROUND OF THE INVENTION

1. Field of the Invention

The present invention is related to the packaging of light-emitting diode that mainly uses silicon wafers as the packaging substrates. Silicon wafers with (100) or (110) crystallization orientation can be etched to form minute groove reflectors. Oxidation treatment can provide good electrical insulation effect. Besides, the packaging process uses silicon rubber dipping (heat resistance up to 200° C.) and does not need a molding process. The present invention has advantages such as high heat resistance, easy production of groove reflector, good heat dissipation, easy miniaturization, so it is much better than traditional SMD LED.

In the present invention, the method of producing grooves on silicon wafers and placing LED chips in the grooves has never been invented before. The present invention has integrated semiconductor micro-machine optoelectronic processing technology into the production of "silicon substrate" specialized for LED, which changes the packaging structure that is based on a combination of traditional PC board, metallic leadframe and "Epoxy" resins. The present invention not only increases the reliability of SMD LED components but also shortens the production process and creates advantages such as high yield and high market competitiveness.

2. Description of the Prior Art

Presently, the packaging of surface mount devices of light-emitting diodes (SMD LED) is mainly divided into circuit type and leadframe type. Wherein, the SMD LED of leadframe type process uses metallic leadframe as substrates and injection molding for plastic grooves or compression molding, followed by cutting into SMD LED, as shown in FIG. 1. The SMD LED of circuit type uses composite circuit board as substrates, followed by compression molding and cutting into SMD LED, as shown in FIG. 2. So far, the SMD LED produced by the two methods has a common shortcoming, i.e. insufficient heat resistance. Especially when SMD components connected with board circuits are passing through high temperature furnace (at about 250~300° C.), the packaging resin for SMD LED does not have sufficient heat resistance. Usually, since the packaging resin has Tg of only about 120° C. and has a different coefficient of thermal expansion from that of the substrates or the leadframes, unusual defects often happen to SMD LED after its passing through high temperature furnace. Another shortcoming is poor heat dissipation. This is due to poor thermal conductance of the packaging resins and substrates. Besides, LED itself is a small heat-generating object, so the temperature increase due to poor heat dissipation will affect emitting efficiency and quality. A further shortcoming is the emitting intensity from the miniaturization without groove reflector has been reduced by more than one-fold (comparison at emitting angle of 30 degree), because it is difficult to use traditional process to make groove reflectors for SMD LED with dimensions of 0603 (1.6×0.7 mm) and 0402 (1.0×0.5 mm). Poor heat resistance, poor heat dissipation and difficulty in making minute groove reflectors are still the biggest problems for traditional SMD LED and have existed for more than twenty years.

After a long time research and development in the field of LED, the present invention has obtained many patents. A solution aiming at the above shortcomings for traditional SMD LED is proposed for improvement along with the present invention of "Packaging of Light-Emitting Diode".

SUMMARY OF THE INVENTION

LED Silicon Substrate Process (A)
1. Select silicon wafers with (100) crystallization orientation (six inches).
2. Apply photoresist and remove unnecessary photoresist by exposure and development.
3. Use anisotropic wet etching to a certain depth and form grooves with declining surface of 54.74 degree (reflectors).
4. On the back of silicon wafers, use dry etching or laser treatment to make penetrating electrode holes.
5. Through oxidation or nitrogenation, form a layer of insulative $SiO_2$ layer or $Si_3N_4$ layer.
6. Plate metallic layers (silver plating, including electrode layer on back of groove reflector).
7. Use laser (Nd-YAG) treatment to cut electrodes in grooves into positive and negative ends.

For etched grooves on silicon substrates, KOH is mostly used as the special wet etching material. When basic KOH is used for etching, since general photoresist will be etched by KOH, it needs to select special photoresist solution, i.e. solution for acidic development. (This type of photoresist is hard to buy in the market.) Another process (B) is necessary when general photoresist is used for etching silicon substrate.

LED Process (B)
1. Select silicon wafers with (100) crystallization orientation.
2. Form a layer of $Si_3N_4$ by heating in nitrogen high temperature furnace.
3. Apply photoresist followed by exposure and development.
4. Use reactive ion etching (RIE) to remove $Si_3N_4$ layer (hard mask) (also called stripping).
5. Use wet etching solution (KOH) to make groove structure.
6. Apply photoresist on the back of silicon wafers, followed by exposure and development.
7. Use RIE plasma etching to remove $Si_3N_4$ layer.
8. Use induction coupling plasma (ICP) for dry etching to make penetrating electrode holes.
9. Through oxidation and nitrogenation treatment for silicon wafers, form an insulative layer on groove surface.
10. Metallic Plating
11. Use laser treatment to cut the grooves into positive and negative ends.

The most apparent difference between A process and B process is that B process uses general photoresist while A process uses acidic development photoresist. In B process, a $Si_3N_4$ layer is formed first, which is then etched by RIE plasma. (RIE etches Si slowly. For another dry etching of Si, ICP will be used.) The above procedures describe the basic process to package silicon substrates of SMD LED in the present invention. For the wet etching of silicon substrate with (100) crystallization orientation, the etching profile is not vertically downward, but a groove of a declining angle of 54.74 degree, which is just suitable as the emitting angle of SMD LED. The formed groove can be applied to small angle SMD LED devices.

Fix LED chips in grooves of silicon substrate, followed by wiring, dipping, cutting into pieces of SMD LED, which accomplishes the first SMD LED device that uses silicon wafers as substrates with high heat resistance, good heat dissipation, small volume and strong emitting intensity.

BRIEF DESCRIPTION OF THE DRAWINGS

The drawings disclose an illustrative embodiment of the present invention, which serves to exemplify the various advantages and objects hereof, and are as follows List of Figures.

Annotation in Figures.

1. Lead Frame Electrode
2. Injection Molded Plastic
3. LED Chip
4. Wire
5. Encapsulation
6. Printed Circuit Board
7. Electrode
8. silicon Substrate
9. Photoresist Layer
10. Developing Area
11. Etching Groove
12. Declined Etching Wall
13. Semi-Through Mole
14. Electrode Through Hole
15. Insulative Layer ($Si_3N_4$ or $SiO_2$)
16. Reflective Layer
17. Electrode, inside 17A groove
18. Electrode, inside 18A groove
19. Electrode Division Line
20. Cutting Line
21. Metal Bump (Solder Bump)
22. Insulative Coating
23. Concave Lens

DETAILED DESCRIPTION OF THE PREFERRED EMBODIMENT

Figure 1:
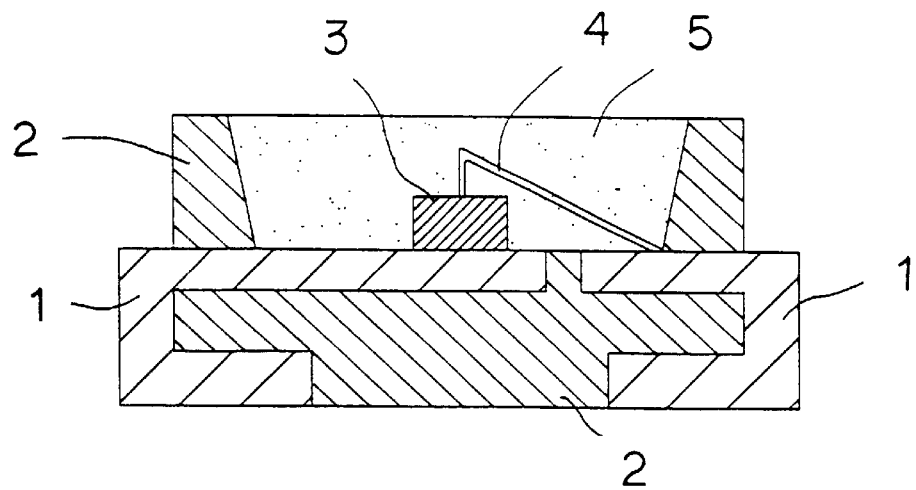
FIG. 1 is the cross-sectional diagram that shows the packaging structure for the SMD LED of traditional metallic leadframe type.

FIG. 1 shows the structural diagram for SMD LED of traditional metal leadframe type (commonly called TOOP-LED type). In its manufacturing process it is first to use heat resistant plastic resin (PPS) for injection molding to form a groove 2 with metal leadframe, followed by die bonding 3, wire bonding 4 and encapsulation 5 etc. Its major packaging material is plastics or EPOXY.

Figure 2:
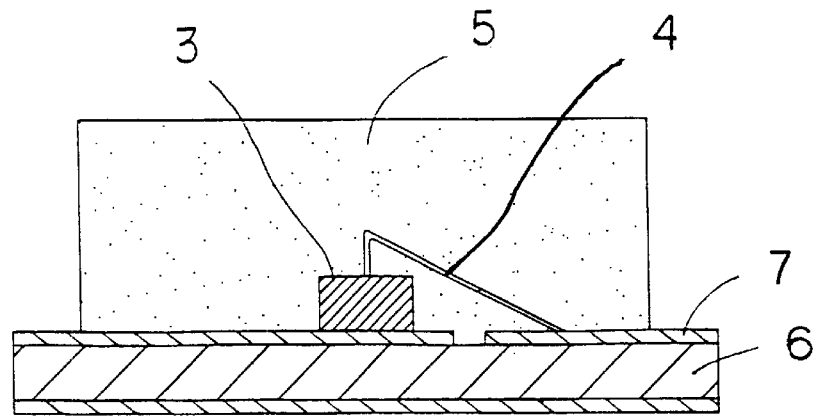
FIG. 2 is the cross-sectional diagram that shows the packaging structure for the SMD LED of traditional circuit type.

FIG. 2 is the structural diagram for SMD LED of traditional circuit board type. In its manufacturing process it is first to fix LED chip to substrate 6 and bond electrode wire 4, followed by die casting to form encapsulation 5, followed by cutting to SMD LED. Its major packaging material is transparent epoxy.

Figure 3:
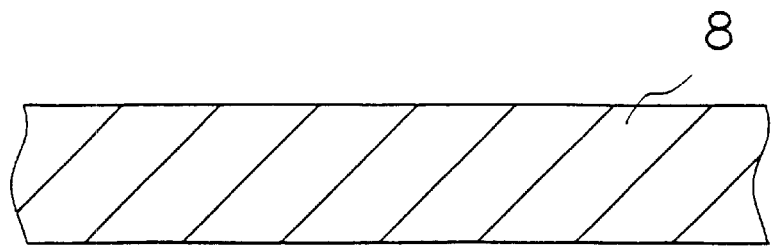
FIG. 3 is the cross-sectional diagram that shows the silicon substrates for the LED package in the present invention.
Figure 4:
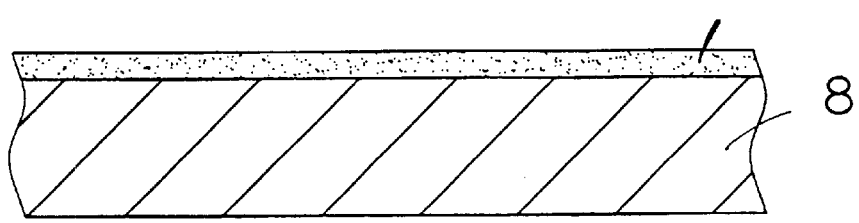
FIG. 4 is the illustrative diagram that shows the photoresist layer on the silicon substrate for the LED package in the present invention.
Figure 5:
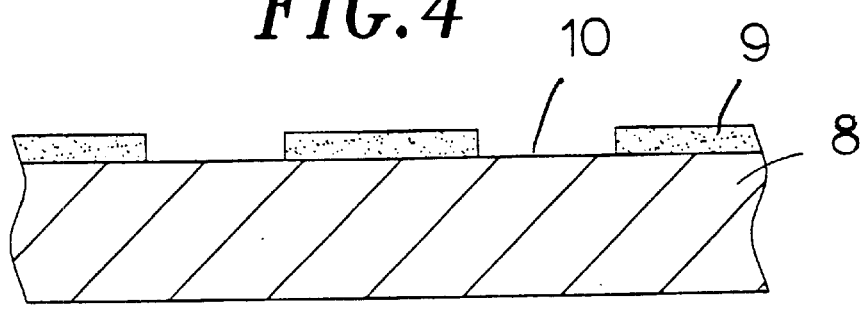
FIG. 5 is the illustrative diagram that shows partial photoresist exposed and developed on the silicon substrate for the LED package in the present invention.
Figure 6:
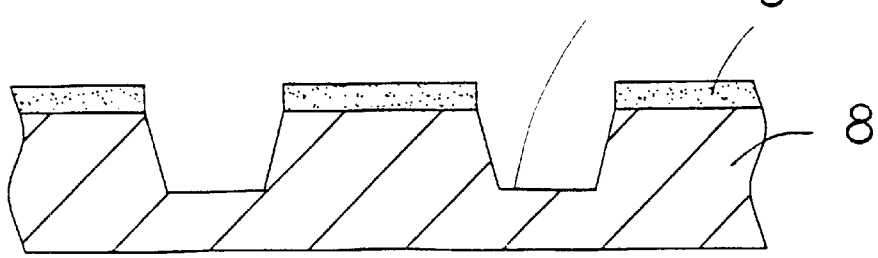
FIG. 6 shows the structural diagram that shows the groove formed by etching the silicon substrate for the LED package in the present invention.
Figure 7:
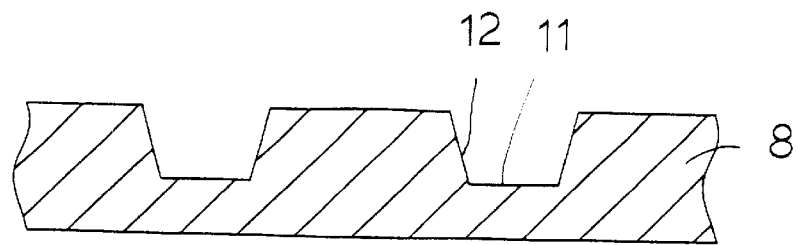
FIG. 7 shows the structural diagram for the silicon substrate that has groove structure after removing photoresist for the LED package in the present invention.
Figure 8:
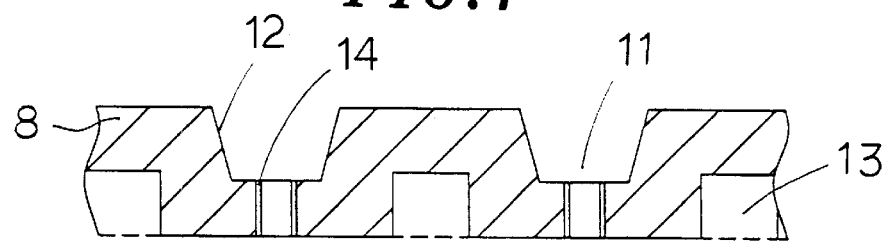
FIG. 8 is the cross-sectional diagram that shows the punching or drilling treatment for the LED package in the present invention.

Please refer to FIG. 3 for "the Packaging of LED". First, a photo resist layer 9 (as shown in FIG. 4) is applied to silicon substrate 8. Then exposure and development process is used to remove the photo resist on the exposure and development area 10 (as shown in FIG. 5). Silicon wafer is etched by an etching solution (KOH) to form grooves 11. Since silicon wafer 8 uses (100) crystallization orientation structure, the etched groove 11 has a declining wall 12 of a declining angle at 54.74 degrees. This declining wall is helpful to light reflection, FIG. 7 shows the structural diagram for the silicon substrate that has a groove structure after removing the photoresist. In FIG. 8, photoresist is applied on the back side of the silicon substrate 8 and the photomask at the back of the groove has an electrode through-hole pattern for development. Exposure and development process aid dry etching (RIE or IPC) are used for drilling holes (semi-through holes) 13. At the same time, electrode guiding holes 14 are made (as shown in FIG. 8). The main purpose of the semi-through holes is that when the substrate is separated into dies by a cutting wire cutting through the center of semi-through holes 13, semi-cylindrical structures are formed for the two terminals of the SMD LED, as shown in FIG. 10(A) aid FIG. 16. Because there is a gold plating layer, such helps plating between SMD LED and board circuits.

The electrode through hole 14 of the silicon substrate in FIG. 8 is for guiding electrode.

Figure 9:
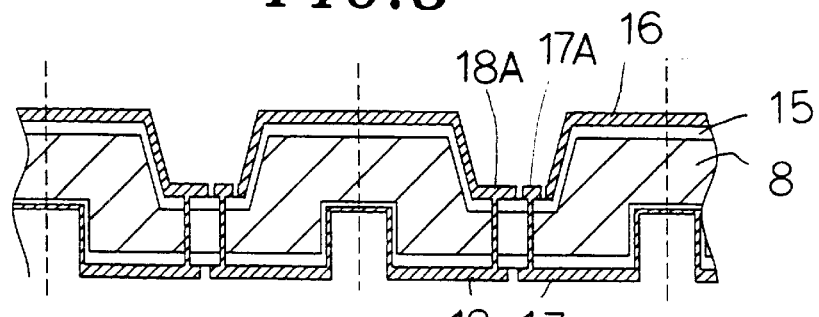
FIG. 9 is the structural diagram for the LED package that has long insulative layer and gold plated layer in the present invention.
Figure 10:
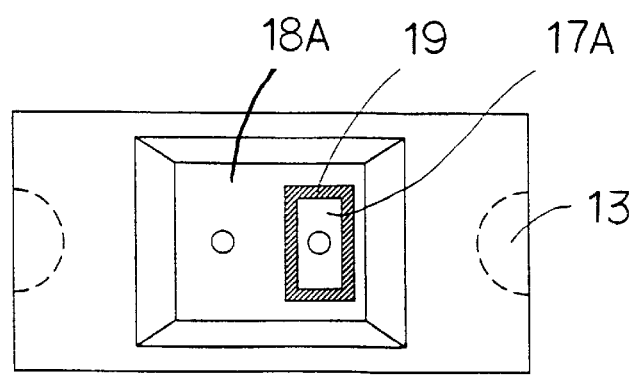
FIG. 10A is the structural diagram for the positive and the negative electrodes that are formed by cutting metallic layers for the LED package in the present invention.
FIG. 10B is the illustrative diagram for the LED package in the present invention that divides metal layers to form flip chip connection of the positive and the negative electrodes.
Figure 10:
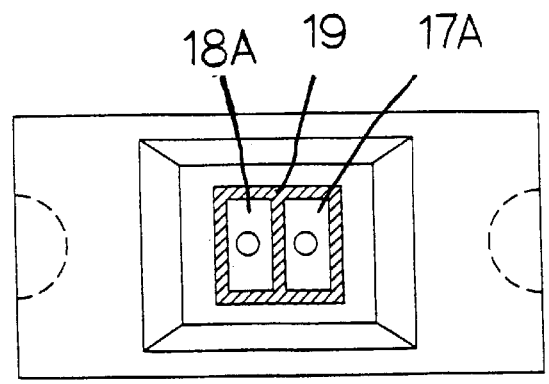

After the completion of structure of silicon substrate, since silicon substrate is a conductor, it is necessary to form a good insulative layer on its surface. The present insulative layer can be made of $SiO_2$ or $Si_3N_4$. A high temperature furnace with oxygen or nitrogen can be simply used to form such a surface insulator 15 as shown in FIG. 9. After the insulative layer 15 is grown, a metal layer 16 is plated. Since the metal layer 16 is plated all over the front and back of silicon wafer and through holes, it is better to be completed at one time. Meanwhile, back metal electrodes 18 and 17 are formed. But the metal electrode in the front groove is hard to be formed by exposure and development process. It needs laser (Nd-YAG) treatment and cutting to form positive and negative electrodes, as the electrodes 17A and 18A in FIG. 10. Division line 19 is of an insulative area. FIG. 10(A) illustrates that traditional LED chip needs wire bonding to connect electrodes. FIG. 10(B) shows the electrode distribution diagram for Flip Chip LED. For blue light or green light LED chip of GaN, the substrate is transparent alumina single crystal. If flip chip packaging process is used with the groove reflector in the present invention, the emitting brightness will be higher than that for traditional packaging structure by more than one fold.

Figure 11:
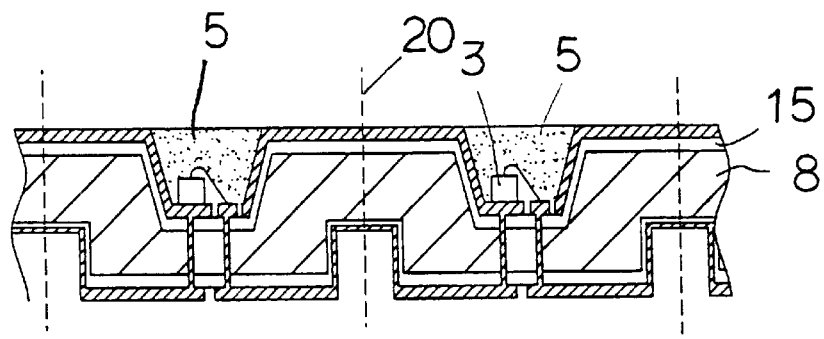
FIG. 11 is the structural diagram for the LED package in the present invention that shows die bonding, wire bonding and dispensing.
Figure 12:
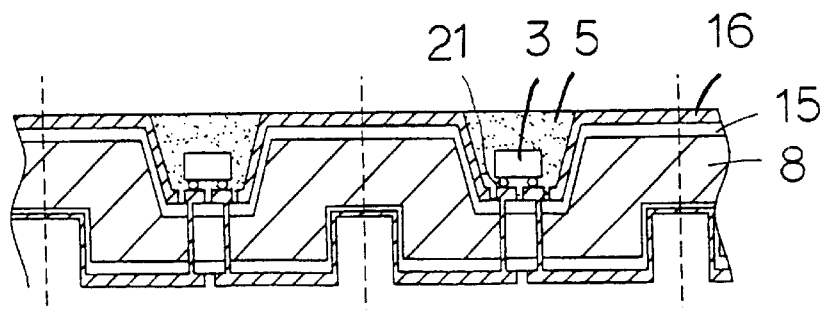
FIG. 12 is the structural diagram for the LED package in the present invention that uses flip chip connection and dispensing.
Figure 13:
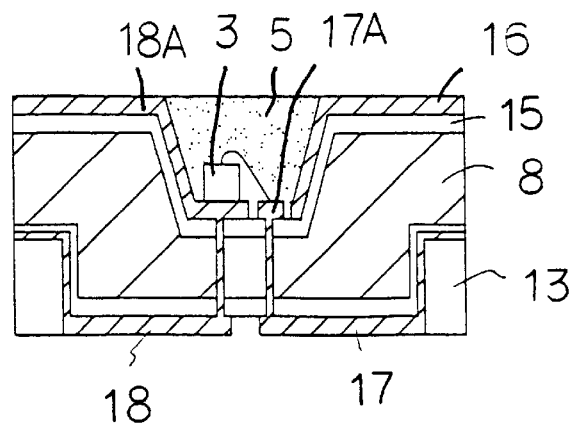
FIG. 13 is the structural diagram for the LED package in the present invention that uses dispensing and cutting for SMD LED.
Figure 14:
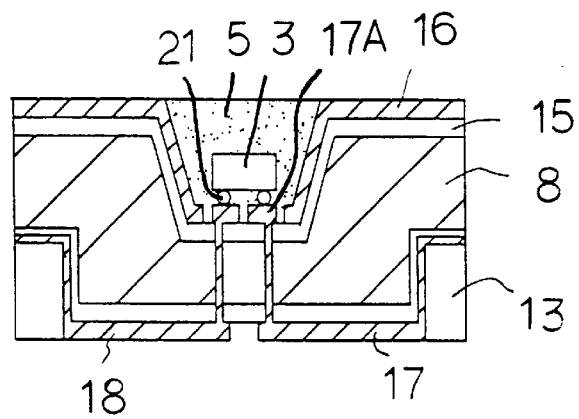
FIG. 14 is the structural diagram for the LED package in the present invention that uses that uses flip chip process to form SMD LED.

FIG. 11 shows that LED chip 3 is placed on the electrode surface 18A in the groove of silicon substrate. At the same time, bonding metal wire 4 is made to connect electrode 17A and encapsulating resin 5 is dispensed. Finally, cutting is carried out at cutting fine 20 of silicon substrate to form SMD LED as in FIG. 13. FIG. 12 and FIG. 14 illustrate the packaging structure of flip chip LED), which directly heats the connecting points 21 on the back of LED chips for soldering on electrode surfaces 17A and 18A, followed by dispensing resin 5 and cutting SMD LED. FIG. 10 and FIG. 13 show the packaging of traditional LED chips.

Figure 15:
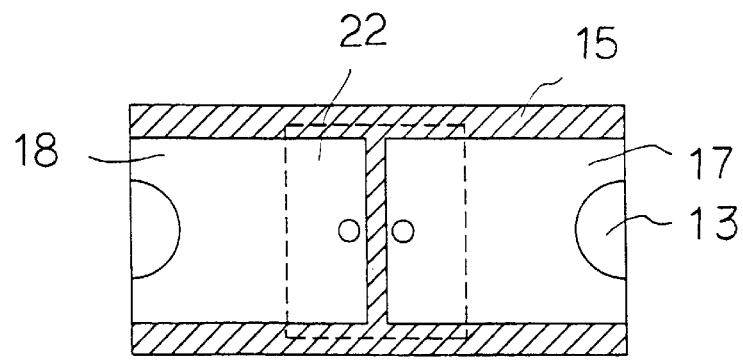
FIG. 15 is the back electrode distribution diagram for the SMD LED in the present invention.

FIG. 15 is the back electrode distribution diagram for the SMD LED in the present invention.

Back electrodes 17 and 18 have to connect with through-hole electrode 14 and groove electrodes 17A and 18A. Since the structure to connect trough-hole electrode 14 in the present invention causes relatively large back electrode surface, which is not good for SMD and may cause short circuit on positive and negative electrodes during soldering, it has to coat an insulative layer 22 to prevent electrode 17 and 18 from getting too close, as shown in FIG. 15.

Figure 16:
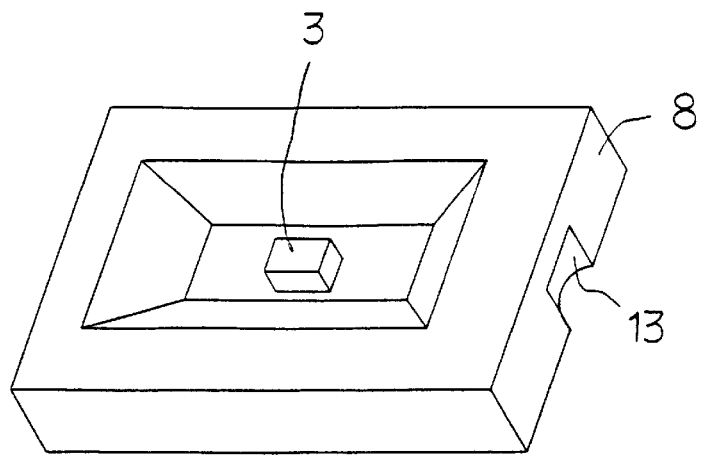
FIG. 16 is the 3-dimensional diagram for the SMD LED package in the present invention that uses flip chip connection.

FIG. 16 is the 3-dimensional diagram for the SMD LED package in the present invention that uses flip chip connection, which packaging material 8 is silicon substrate, not traditional epoxy resins.

Figure 17:
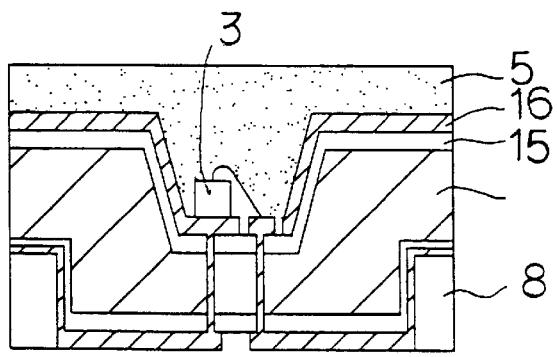
FIG. 17 is the surface encapsulation for the SMD LED package in the present invention that uses die casting.
Figure 18:
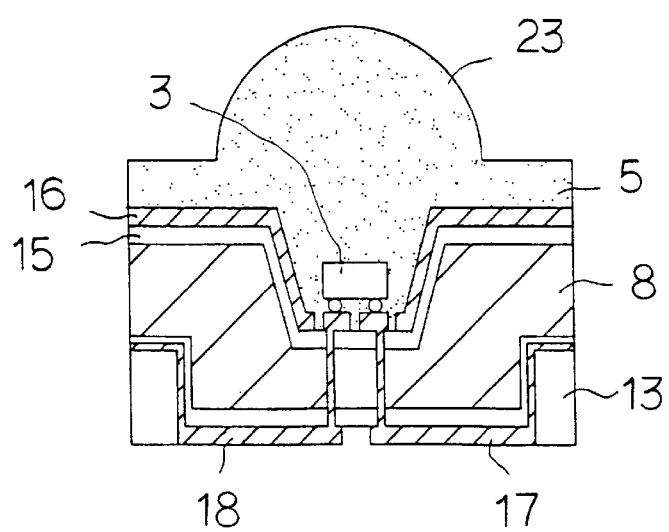
FIG. 18 is the surface encapsulation for the SMD LED package in the present invention that forms a structure of concave lens.

FIG. 17 is the surface encapsulation for the SMD LED package in the present invention that uses die casting, which only uses encapsulating resin 5 on positive electrode surface and the packaging substrate 8 is all silicon substrate. So far, most encapsulation inside the silicon substrate groove uses dispensing method, which has advantages of simple process without molds. But sometimes it uses surface die casting method for encapsulation to thicken SMD and to form structure 23 of concave lens on SMD surface, as shown in FIG. 18.

From the above description of the preferred embodiments, "the packaging of LED" in the present invention directly fix LED chips (GaAs, GaN and SiC etc) on silicon substrate with groove, which itself is LED packaging material. Compared to traditional packaging material for SMD LED, the present invention has advantages like easy miniaturization, good heat dissipation, strong emitting brightness and good heat resistance etc.

Figure 19:
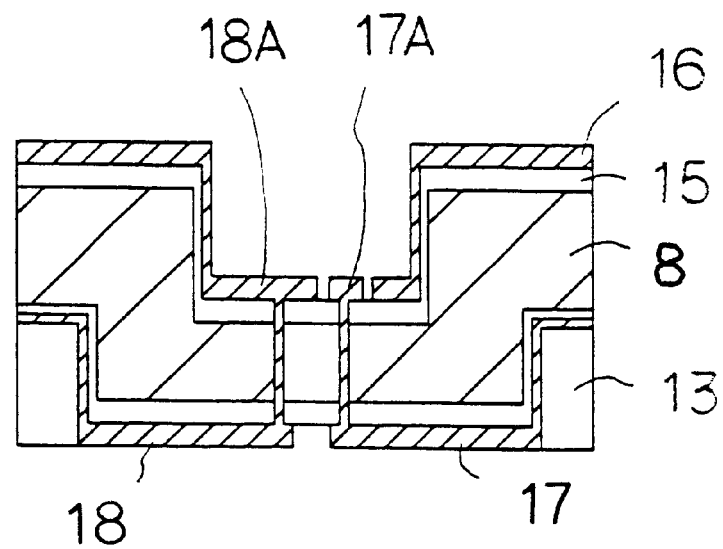
FIG. 19 is the structural diagram for the LED package in the present invention that the silicon substrate uses (100) crystallization orientation for etching to form vertical grooves.

The described embodiment above is based on single crystal silicon wafer with (100) crystallization orientation. If crystallization orientation (110) is used, the etched structure is the groove with vertical wall as shown in FIG. 19, which groove can be used for SMD LED of smaller emitting angle.

Figure 20:
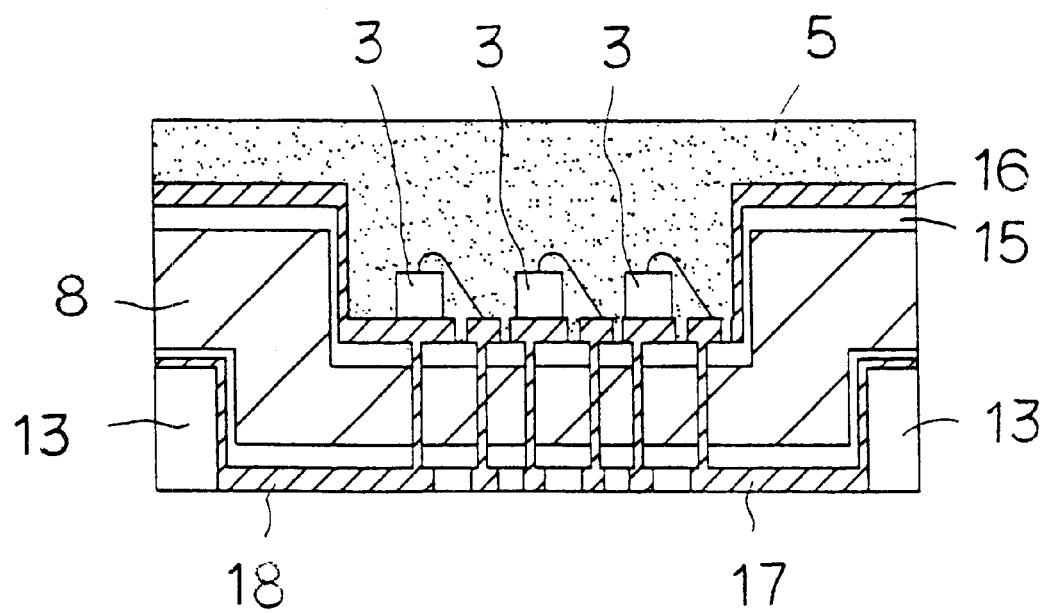
FIG. 20 is the structural diagram for the LED package in the present invention that multiple number of LED chips can be placed in the single groove reflector.

FIG. 20 shows that a number of LED chips can be placed in the same groove to obtain a single SMD LED providing high brightness effect.

Further, instead of using single crystal silicon wafer, if the present invention uses other single crystal chips like $SiO_2$, commonly called quartz single crystal, etching will result in groove structure with different declining angel. Different results can be obtained from using different crystallization orientation.

Many changes and modifications in the above-described embodiment of the invention can, of course, be carried out without departing from the scope thereof. Accordingly, to promote the progress in science and the useful arts, the invention is disclosed to be limited only by the scope of the appended claims.

What is claimed is:

1. A process for forming an LED packaging substrate, comprising the steps of:
   a. providing a silicon wafer substrate having opposing front and back sides;
   b. applying photoresist on the front side of the silicon wafer substrate;
   c. exposing and developing the photoresist to define predetermined areas;
   d. wet etching the substrate to form groove reflectors;
   e. applying photoresist on the back side of the silicon wafer substrate;
   f. exposing and developing the photoresist to define a through-hole pattern in respective aligned relationship with the groove reflectors;
   g. dry etching the through-hole pattern to form electrode holes through the silicon wafer substrate;
   h. removing the photoresist from the silicon wafer substrate;
   i. forming an insulation layer on the front and back sides of the substrate by oxidation or nitridation;
   j. applying a conductive metal layer by electroplating to the front and back sides of silicon substrate and inside electrode holes; and,
   k. laser treating the conductive metal layer to cut an electrode surface in the groove reflectors into positive and negative electrode contacting surfaces for respective connection with LED chips placed inside the groove reflectors.

2. The process for forming an LED packaging substrate of claim 1, wherein the conductive metal plating layer provides both electrical conductance and light reflection and is made of materials selected from the group consisting of Ag, Au, Pd, and Pt.

3. The process for forming an LED packaging substrate of claim 1, wherein the silicon wafer substrate uses (100) crystallization orientation to form the groove reflectors with declining walls by etching in step d.

4. The process for forming an LED packaging substrate of claim 1, wherein the silicon wafer substrate uses (110) crystallization orientation to form the groove reflectors with vertical walls by etching in step d.

5. The process for forming an LED packaging substrate of claim 1, wherein the wet etching step includes the step of using an etching solution of KOH.

6. A process for forming an LED packaging substrate of claim 1, further comprising the steps of:

placing LED chips in the groove reflectors of the silicon wafer substrate;

respectively connecting positive and negative electrodes of the LED chips to the positive and negative electrode contacting surfaces of the groove reflectors of the silicon wafer substrate;

covering the LED chips and completely filling the groove reflectors with an encapsulating resin;

heating the silicon wafer substrate to cure the encapsulating resin; and, cutting the silicon wafer substrate to form individual SMD LED dies.

7. The process for forming an LED packaging substrate of claim 6, wherein the encapsulating resin is a transparent and high-temperature resistant silicon rubber or epoxy.

* * * * *